(12) United States Patent
Arai

(10) Patent No.: US 10,018,909 B2
(45) Date of Patent: Jul. 10, 2018

(54) IMPRINT APPARATUS AND METHOD OF MANUFACTURING ARTICLE

(71) Applicant: CANON KABUSHIKI KAISHA, Tokyo (JP)

(72) Inventor: Tsuyoshi Arai, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 774 days.

(21) Appl. No.: 14/373,533

(22) PCT Filed: Jan. 9, 2013

(86) PCT No.: PCT/JP2013/050702
§ 371 (c)(1),
(2) Date: Jul. 21, 2014

(87) PCT Pub. No.: WO2013/118546
PCT Pub. Date: Aug. 15, 2013

(65) Prior Publication Data
US 2015/0001749 A1    Jan. 1, 2015

(30) Foreign Application Priority Data
Feb. 7, 2012  (JP) ................. 2012-024522

(51) Int. Cl.
*B29C 59/02*  (2006.01)
*G03F 7/00*  (2006.01)
(Continued)

(52) U.S. Cl.
CPC ............ *G03F 7/0002* (2013.01); *B29C 43/00* (2013.01); *B29C 43/58* (2013.01); *B29C 59/002* (2013.01);
(Continued)

(58) Field of Classification Search
CPC .................................... G03F 7/0002
See application file for complete search history.

(56) References Cited

U.S. PATENT DOCUMENTS 7,803,308 B2   9/2010   Ganapathisubramanian et al.
8,444,889 B2   5/2013   Tokue et al.
(Continued)

FOREIGN PATENT DOCUMENTS

CN    101316693 A    12/2008
CN    101394989 A     3/2009
(Continued)

OTHER PUBLICATIONS

Korean Office Action issued in counterpart application No. KR10-2014-7024293, dated Dec. 11, 2015.
(Continued)

*Primary Examiner* — Timothy Kennedy
(74) *Attorney, Agent, or Firm* — Rossi, Kimms & McDowell LLP

(57) ABSTRACT

The present invention provides an imprint apparatus which performs an imprint process of transferring a pattern onto a substrate, the apparatus comprising a deforming unit configured to deform the pattern surface by applying a force to the mold, an obtaining unit configured to obtain thickness information of the mold, a calculation unit configured to calculate a force to be applied to the mold based on the thickness information of the mold obtained by the obtaining unit, so that the pattern surface has a target shape in the imprint process, and a control unit configured to control the deforming unit to apply the force calculated by the calculation unit to the mold in the imprint process.

8 Claims, 6 Drawing Sheets

(51) Int. Cl.

| | |
|---|---|
| *G11B 5/84* | (2006.01) |
| *G11B 5/855* | (2006.01) |
| *B29C 43/00* | (2006.01) |
| *B41L 19/00* | (2006.01) |
| *B29C 43/58* | (2006.01) |
| *B82Y 10/00* | (2011.01) |
| *B82Y 40/00* | (2011.01) |
| *B29C 59/00* | (2006.01) |
| *G01B 21/08* | (2006.01) |

(52) U.S. Cl.
CPC .............. *B41L 19/00* (2013.01); *B82Y 10/00* (2013.01); *B82Y 40/00* (2013.01); *G01B 21/08* (2013.01); *G11B 5/84* (2013.01); *G11B 5/855* (2013.01)

(56) References Cited

U.S. PATENT DOCUMENTS

| | | | |
|---|---|---|---|
| 8,953,175 | B2 | 2/2015 | Sato |
| 2006/0157444 | A1 | 7/2006 | Nakamura et al. |
| 2008/0099941 | A1 | 5/2008 | Suehira et al. |
| 2008/0160129 | A1 | 7/2008 | Resnick et al. |
| 2010/0096775 | A1 | 4/2010 | Koh |
| 2010/0244326 | A1 | 9/2010 | Tokue et al. |
| 2011/0180965 | A1* | 7/2011 | Zhang .................. G03F 7/0002 425/174.4 |
| 2011/0229988 | A1 | 9/2011 | Asano et al. |

FOREIGN PATENT DOCUMENTS

| | | |
|---|---|---|
| EP | 1669802 A2 | 6/2006 |
| JP | 2009-517882 A | 4/2009 |
| JP | 2009-536591 A | 10/2009 |
| JP | 2011127979 A | 6/2011 |
| JP | 2011-199052 A | 10/2011 |
| KR | 20100107390 A | 10/2010 |
| WO | 2007046528 A2 | 4/2007 |
| WO | 2007/064386 A1 | 6/2007 |
| WO | 2007067469 A2 | 6/2007 |
| WO | 2007099907 A1 | 9/2007 |
| WO | 2007/132320 A2 | 11/2007 |
| WO | 2010044756 A2 | 4/2010 |

OTHER PUBLICATIONS

European Search Report issued in EP13746658.7 dated May 26, 2015.

Chinese Office Action issued in counterpart application No. CN201380007877.7, dated Dec. 22, 2015. English translation provided.

International Search Report for PCT/JP2013/050702, dated Feb. 19, 2013.

Notification of Transmittal of the International Search Report and the Written Opinion of the International Searching Authority, or the Declaration, dated Feb. 19, 2013.

* cited by examiner

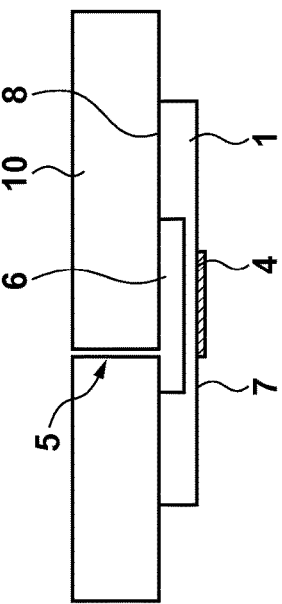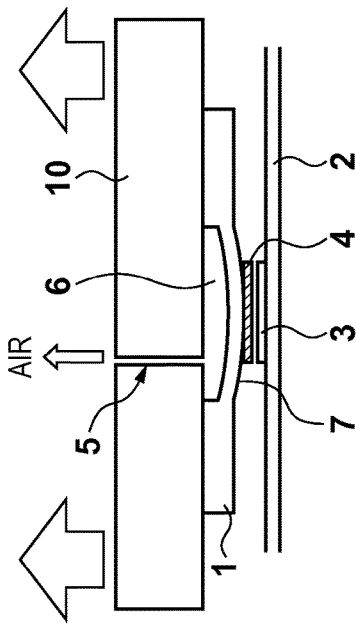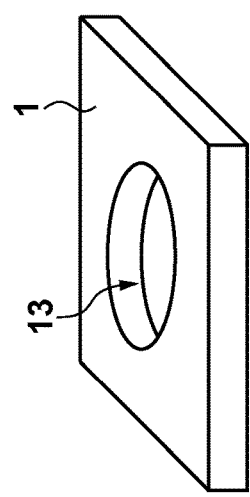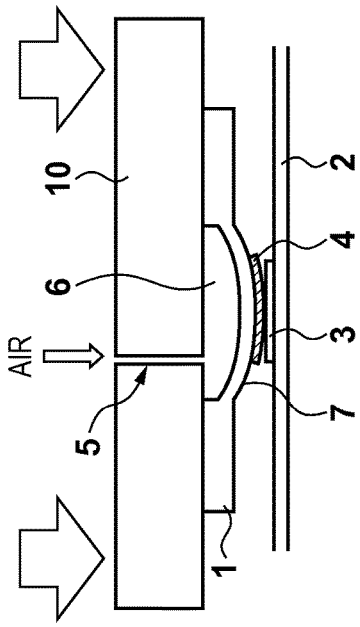

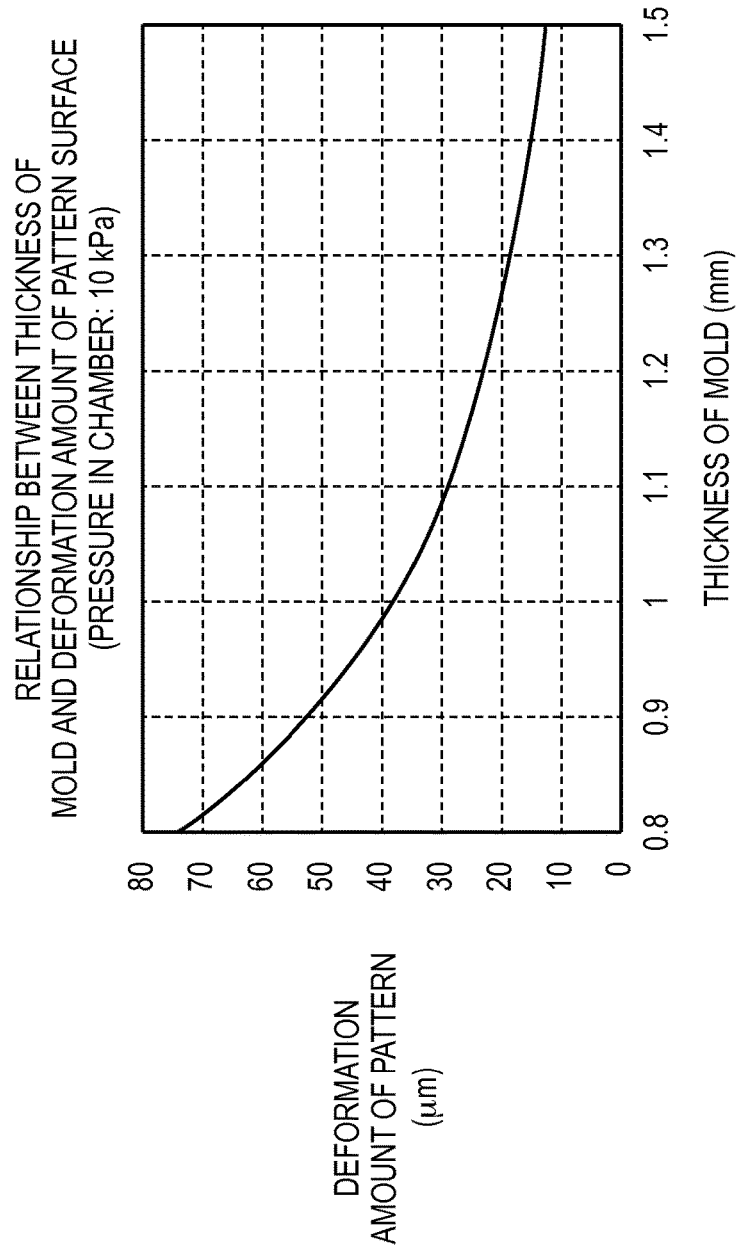

IMPRINT APPARATUS AND METHOD OF MANUFACTURING ARTICLE

TECHNICAL FIELD

The present invention relates to an imprint apparatus and a method of manufacturing an article.

BACKGROUND ART

The imprint technique is attracting a great deal of attention as one of nano-lithography techniques for volume production of, for example, magnetic storage media and semiconductor devices. In the imprint technique, a pattern is transferred onto a substrate such as a silicon wafer or a glass plate using, as an original, a mold having a fine pattern formed on it.

An imprint apparatus which uses such an imprint technique presses a mold against a substrate via a resin (imprint material) supplied on the substrate, and cures the resin in this state. The imprint apparatus then separates the mold from the cured resin to transfer the pattern of the mold onto the substrate. At this time, it is necessary to prevent loss of the pattern transferred onto the substrate. To meet, this requirement, Japanese Patent Laid-Open Mos. 2009-536591 and 2009-517882 propose techniques of deforming (curving) the mold so as to form a convex surface that bulges toward the substrate in bringing the mold into contact with the resin on the substrate, or separating the mold from the cured resin.

An imprint apparatus generally uses a plurality of molds, each of which is applied with a predetermined force to deform each mold in the same amount (in a predetermined amount) in a mold deforming operation (that is, in an imprint process). However, the thickness of each mold varies due, for example, to manufacturing errors and dimension errors. Therefore, when the force to be applied to each mold remains the same, the deformation amount of each mold in an imprint process varies. As a result, the dimension and shape of the pattern transferred onto the substrate vary across individual molds, or loss is generated in the transferred pattern.

SUMMARY OF INVENTION

The present invention provides a technique advantageous in terms of pattern transfer accuracy in an imprint apparatus.

According to one aspect of the present invention, there is provided an imprint apparatus which performs an imprint process of curing a resin on a substrate while a mold having a pattern surface on which a pattern is formed is kept in contact with the resin, and separating the mold from the cured resin, thereby transferring the pattern onto the substrate, the apparatus comprising: a deforming unit configured to deform the pattern surface by applying a force to the mold; an obtaining unit configured to obtain thickness information of the mold; a calculation unit configured to calculate a force to be applied to the mold based on the thickness information of the mold obtained by the obtaining unit, so that the pattern surface has a target, shape in the imprint process; and a control unit, configured to control the deforming unit to apply the force calculated by the calculation unit to the mold in the imprint process.

According to one aspect of the present invention, there is provided an imprint apparatus which performs an imprint process of curing a resin on a substrate while a mold having a pattern surface on which a pattern is formed is kept in contact with the resin, and separating the mold from the cured resin, thereby transferring the pattern onto the substrate, the apparatus comprising: a deforming unit, configured to deform the pattern surface by applying a force to the mold; a storage unit configured to store a correspondence between a plurality of molds, and a force to be applied to each of the plurality of molds so that the pattern surface has a target, shape in the imprint process; an obtaining unit, configured to specify a mold to be used in the imprint process among the plurality of molds, and obtain a force to be applied to the specified mold based, on the correspondence stored in the storage unit; and a control unit configured to control the deforming unit to apply the force obtained by the obtaining unit to the mold in the imprint process.

Further features of the present invention will become apparent from the following description of exemplary embodiments with reference to the attached drawings.

BRIEF DESCRIPTION OF DRAWINGS

FIG. 2A is a view showing the configuration of a mold;

FIG. 2B is a view showing the state in which a holding unit, holds the mold;

FIG. 2C is a view showing the state in which the mold is brought into contact with a resin on a substrate;

FIG. 2D is a view showing the state in which the mold is separated, from the cured resin;

FIG. 3 is a graph showing the relationship between the thickness of the mold and the deformation amount of the pattern surface according to the present invention;

DESCRIPTION OF EMBODIMENTS

Figure 1:
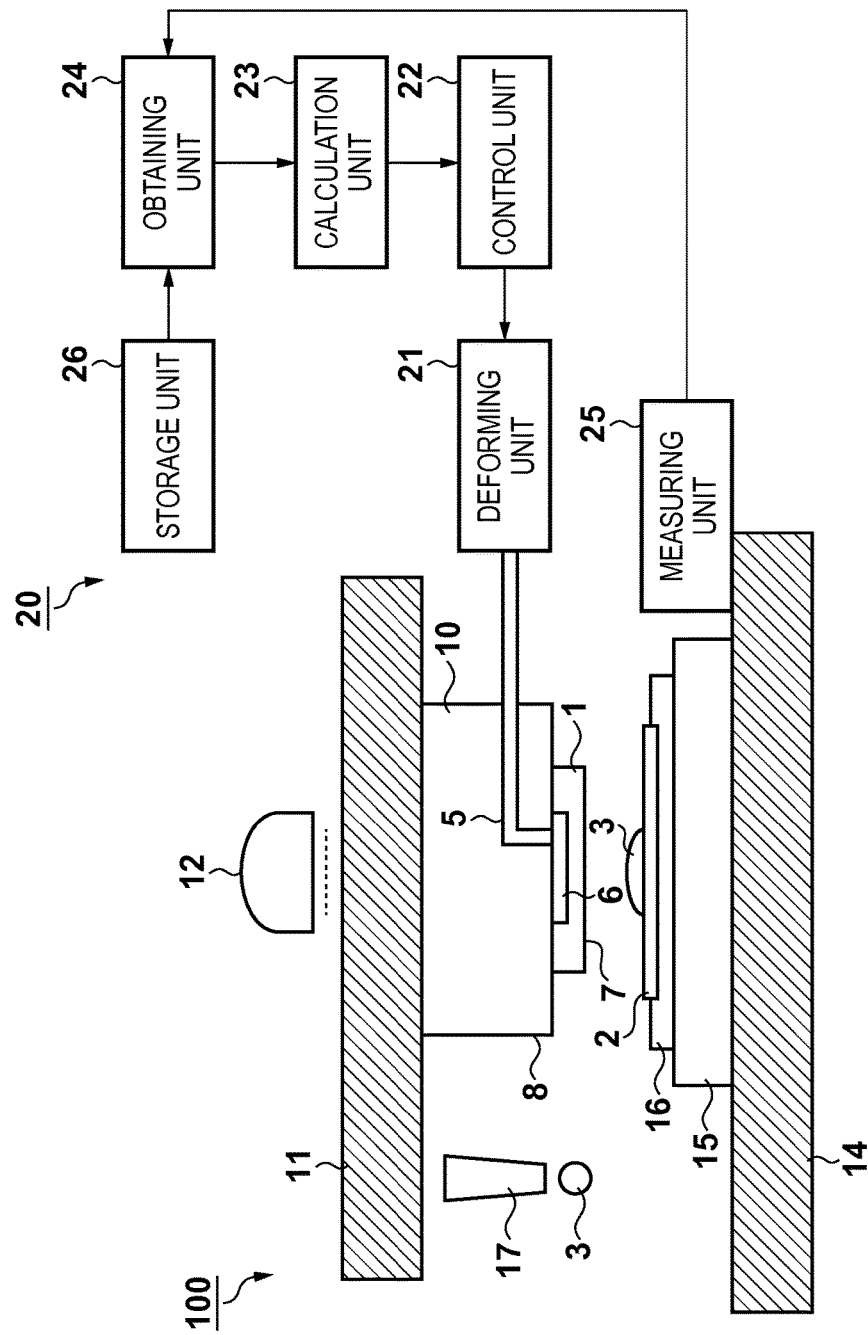
FIG. 1 is a view showing the configuration of an imprint apparatus according to the first, embodiment of the present invention.

Exemplary embodiments of the present invention will be described below with reference to the accompanying drawings. Note that the same reference numerals denote the same members throughout the drawings, and a repetitive description thereof will not be given.

First Embodiment

An imprint apparatus 100 according to the first embodiment of the present invention will be described with reference to FIG. 1. The imprint apparatus 100 performs an imprint process of curing a resin on a substrate while a mold having a pattern formed on it is kept, in contact with the resin, and separates the mold from the cured resin, thereby transferring the pattern onto the substrate.

The imprint apparatus 100 includes a holding unit 10 which holds a mold 1, a structure 11, an ultraviolet light source 12, a stage base 14, a substrate stage 15, a substrate chuck 16, and a resin supply unit 17. The imprint apparatus 100 also includes a deforming unit 21, control unit 22, calculation unit 23, and obtaining unit 24 as a control system 20 which performs an imprint process upon deforming the mold 1.

The mold 1 is held by the holding unit 10, and has a pattern surface 7 on which a pattern 4 is formed. The surface of the mold 1, which is opposite to the pattern surface 7, contacts a holding surface 8 of the holding unit 10. The holding unit 10 is attached to the structure 11 and lifted or lowered by a driving source and a control mechanism (neither is shown) to bring a substrate 2 and the mold 1 close to each other or separate them from each other. The resin supply unit 17 for dispensing (supplying) a resin 3 onto the substrate 2 is arranged on the structure 11.

The substrate 2 is held by the substrate stage 15 through the substrate chuck 16. The substrate stage 15 moves on the stage base 14. In dispensing the resin 3 onto the substrate 2, the substrate stage 15 is moved so that the substrate 2 is arranged below the resin supply unit 17, and the resin 3 is dispensed onto the substrate 2. After the resin 3 is dispensed onto the substrate 2, the substrate stage 15 is moved so that a region dispensed with the resin 3, that is, a shot, region is arranged below the mold 1.

The ultraviolet light source 12 has a function of curing the resin 3 dispensed on the substrate 2. In this embodiment, the holding unit 10 is lowered to bring the mold 1 having the pattern 4 formed on it into contact with the resin 3 on the substrate 2. In this state, the ultraviolet light-source 12 irradiates the resin 3 on the substrate 2 with ultraviolet rays to cure it. After the resin 3 cures, the holding unit 10 is lifted to separate the mold 1 from the resin 3 on the substrate 2.

The imprint apparatus 100 performs such an imprint process to transfer a fine pattern onto the substrate 2. Although the imprint apparatus in the first embodiment irradiates the resin 3 on the substrate 2 with ultraviolet rays to cure the resin 3 on the substrate 2, it may heat and cure the resin 3 on the substrate 2. In this case, in place of the ultraviolet light source 12, a heat source such as a heater need only be arranged on the holding unit 10. Although the holding unit 10 which holds the mold 1 is lifted or lowered in bringing the mold 1 into contact with the resin 3 on the substrate 2 in this embodiment, the substrate stage 15 which holds the substrate 2 may be lifted or lowered.

To prevent loss of the pattern transferred onto the substrate 2, the imprint apparatus 100 applies a force to the mold 1 to deform it so that the pattern surface 7 forms a convex surface that bulges toward the substrate 2.

FIG. 2A is a view showing the configuration of the mold 1. The mold 1 has a concave portion 13 formed by drilling its surface on the side of the holding surface so as to reduce the thickness of the portion in which the pattern 4 is formed, that is, the pattern surface 7, as shown in FIG. 2A. By reducing the thickness of the portion in which the pattern 4 is formed, that is, the pattern surface 7, the pattern surface 7 can easily deform upon being applied with a pressure (to be described later).

FIG. 2B is a view showing the state in which the holding unit 10 holds the mold 1. The concave portion 13 in the mold 1 forms a practically airtightly sealed space in cooperation with the holding surface 8 of the holding unit 10, as shown in FIG. 2B. The space formed by the concave portion 13 in the mold 1, and the holding surface 8 of the holding unit 10 will be referred to as a chamber 6 hereinafter. A pipe 5 is formed in the holding unit 10 to communicate with the chamber 6. The pipe 5 is connected to the deforming unit 21. The deforming unit 21 is implemented by a pressure controller including, for example, a servo valve and a switching valve for switching between a supply source which supplies compressed air to the chamber 6 and that which evacuates the chamber 6 to a vacuum. The deforming unit 21 changes the pressure in the chamber 6 under the control of the control unit 22. By changing the pressure in the chamber 6 in this way, the pattern surface 7 of the mold 1 can be deformed into a convex or concave shape to bulge toward the substrate 2. When, for example, a 70-mm diameter cylindrical chamber 6 is pressurized to 10 kPa, and the thickness of the peripheral portion (pattern surface 7) including the pattern 4 of the mold 1 is 1 mm, the pattern surface 7 deforms by about 40 μm into a convex shape to bulge toward the substrate Z.

FIG. 2C is a view showing the state in which the mold 1 is brought into contact with the resin 3 on the substrate 2 in an imprint process. In bringing the mold 1 into contact with the resin 3 on the substrate 2, the chamber 6 is pressurized to deform the mold 1 so that the pattern surface 7 has a convex shape to bulge toward the substrate 2. As the mold 1 comes close to the resin 3 on the substrate 2 when the pattern surface 7 has deformed in a convex shape, the pattern surface 7 of the mold 1 and the resin 3 on the substrate 2 continuously contact each other outwards from the center of the pattern surface 7. This makes it possible to suppress entrapment of air bubbles in the gap between the pattern surface 7 and the resin 3.

FIG. 2D is a view showing the state in which the mold 1 is separated from the cured resin 3 in the imprint process. In separating the mold 1 from the cured resin 3, the cured resin 3 and the pattern surface 7 have adhered to each other, so the pattern surface 7 deforms into a convex surface that bulges toward the substrate 2 as the mold 1 is pulled toward the substrate 2. To control such deformation of the pattern surface 7, the chamber 6 is depressurized in this embodiment.

In this manner, in bringing the mold 1 into contact with the resin 3 on the substrate 2, or separating the mold 1 from the cured resin 3, loss of the pattern transferred onto the substrate 2 can be prevented by controlling the pressure in the chamber 6.

The imprint apparatus 100 generally uses a plurality of exchangeable molds 1. Each of the plurality of molds 1 transmits ultraviolet light from the ultraviolet light source 12, and is therefore manufactured by machining silica glass. Hence, the thickness of each mold 1 (especially the thickness of the pattern surface 7) varies due, for example, to manufacturing errors and dimension errors. This means that when the pattern surface 7 deforms while the pressure applied to each mold 1 remains the same, the deformation amount of the pattern surface 7 (the difference between the vertex of the pattern surface 7 before pressurization and that of the pattern surface 7 after pressurization) varies across individual molds 1. As a result, the dimension and shape of the pattern transferred onto the substrate 2 vary across individual molds 1. FIG. 3 is a graph showing the relationship between the thickness of the mold 1 and the deformation amount of the pattern surface 7 when the chamber 6 is pressurized to a predetermined pressure of 10 kPa. The deformation amount of the pattern surface 7 changes in inverse proportion to the cube of the thickness of the mold 1. Therefore, even a very small difference in thickness of each mold 1 leads to a large difference in deformation amount of the pattern surface 7.

For this reason, the imprint apparatus 100 includes the deforming unit 21, control unit 22, obtaining unit 24, and calculation unit 23 as the control system 20. The obtaining unit 24 obtains the thickness information of the mold 1. The calculation unit 23 calculates the force to be applied to the mold 1 based on the thickness information of the mold 1 obtained by the obtaining unit 24, so that the pattern surface 7 has a target, shape in an imprint process. The control unit 22 controls the deforming unit 21 to apply the force calculated by the calculation unit 23 to the mold 1 in an imprint process. In this manner, by controlling the force to be applied to each mold 1 in accordance with the thickness information of this mold 1, the pattern surface 7 of this mold 1 can be made to have the same shape (target shape) even if the thickness of this mold 1 used in an imprint process varies.

Figure 4:
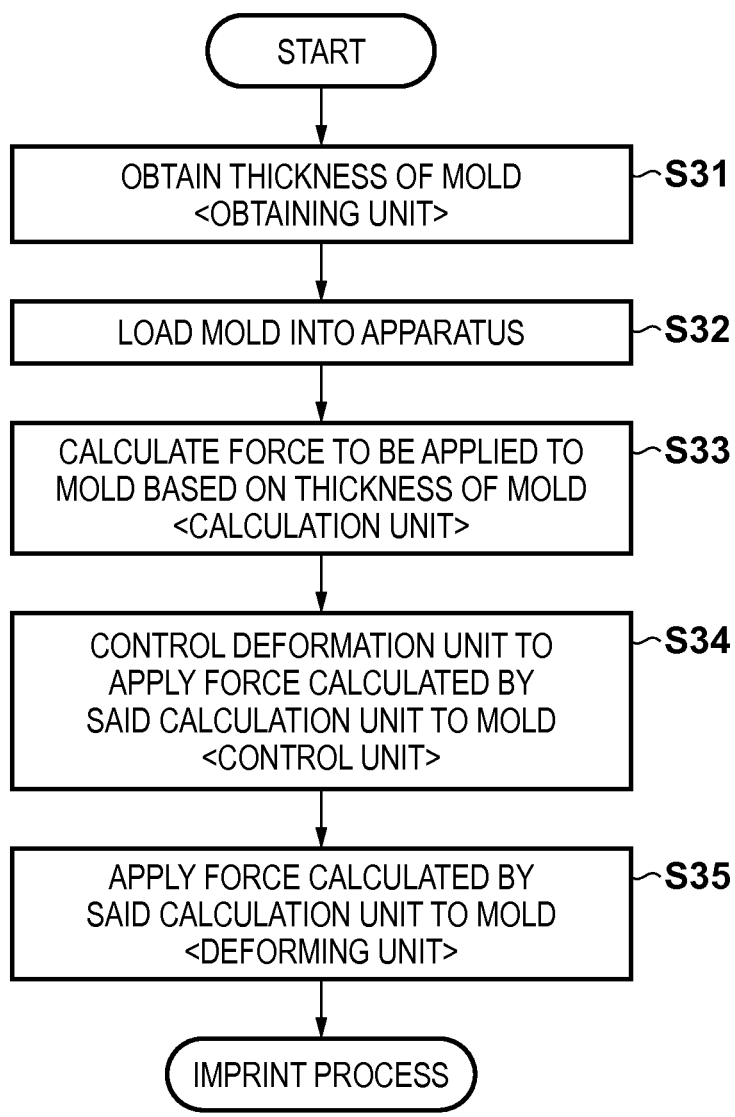
FIG. 4 is a flowchart for explaining the operation of the imprint apparatus according to the first embodiment of the present invention.

FIG. 4 is a flowchart for explaining an imprint process by the imprint, apparatus 100 according to the first embodiment.

In step S31, before a mold 1 is loaded into the imprint apparatus 100, the obtaining unit 24 obtains the thickness information of the mold 1 (the peripheral portion including the pattern, that is, the pattern surface 7). The thickness information of the mold 1 is obtained by, for example, measuring, in advance, the thickness of the mold 1 using an external device for the imprint apparatus 100 after the mold 1 is fabricated. If the imprint apparatus 100 has a measuring unit 25, the measuring unit 25 can be used to obtain the thickness information of the mold 1. An optical displacement, sensor, an ultrasonic sensor, a pneumatic micrometer, or an electric micrometer, for example, can be used as the measuring unit 25 to measure the thickness of the mold 1. A storage unit 26 which stores the correspondence between each mold 1 and the thickness information of this mold 1 may further be provided in the imprint apparatus 100. In this case, the obtaining unit 24 specifies a mold 1 to be used in an imprint process, and obtains the thickness information of the specified mold 1 based on the correspondence stored in the storage unit 26. More specifically, an identification number (ID) is assigned to each mold 1 and read as the mold 1 is en route to the holding unit 10. Based on the read ID, the obtaining unit 24 specifies (identifies) the loaded mold 1 to obtain the mold thickness information corresponding to the specified mold 1 from the storage unit 26.

In step S32, the mold 1 is loaded into the imprint apparatus 100 and held by the holding unit 10. In step S33, the calculation unit 23 calculates the force to be applied to the mold 1 based on the thickness information of the mold 1 obtained by the obtaining unit 24, so that the pattern surface 7 has a target shape. In this embodiment, since a pressure is applied to the chamber 6 to apply a force to the mold 1, the following description assumes that the force to be applied to the mold 1 is the pressure to be applied to the chamber 6. The calculation unit 23 has an arithmetic expression according to which the pressure to be applied to the chamber 6 is calculated in correspondence with the thickness information of the mold 1. The calculation unit 23 uses an arithmetic expression to calculate the pressure to be applied to the chamber 6 based on the thickness information of the mold 1 obtained by the obtaining unit 24. Note that the calculation unit 23 may have the correspondence between the thickness information of the mold 1 and the pressure to be applied to the chamber 6, in place of the above-mentioned arithmetic expression. In this case, the calculation unit 23 calculates the pressure which is to be applied to the chamber 6 and corresponds to the thickness information of the mold 1 obtained by the obtaining unit 24, based on the correspondence between the thickness information of the mold 1 and the pressure to be applied to the chamber 6.

In step S34, the control unit 22 controls the deforming unit 21 to apply the force calculated by the calculation unit 23 to the mold 1. In step S35, the deforming unit 21 applies the force calculated by the calculation unit 23 to the mold 1 under the control of the control unit 22. More specifically, the control unit 22 controls the deforming unit 21 to apply the pressure calculated by the calculation unit 23 to the chamber 6. With this operation, the deforming unit 21 pressurizes or depressurizes the chamber 6 so that the pressure in the chamber 6 stays that calculated by the calculation unit 23. When the mold 1 is brought into contact with the resin 3 on the substrate 2, the deforming unit 21 pressurizes the chamber 6 so that the pattern surface 7 forms a convex surface that bulges toward the substrate Z.

In the first embodiment, the pattern surface 7 can be made to have a target shape in an imprint process by controlling the force to be applied to each mold 1 (the pressure in the chamber 6) in accordance with the thickness information of this mold 1. With this operation, even if the thickness of each mold 1 varies, this mold 1 can serve to reproduce the shape (target shape) of the pattern surface 7, which is optimized to prevent generation of either air bubbles in the gap between the mold 1 and the resin 3 or loss of the pattern transferred onto the substrate 2. This makes it possible to suppress variations in dimension and shape of the pattern transferred onto the substrate 2 across individual molds 1.

The imprint apparatus 100 according to the first embodiment is also effective in transferring the patterns of a plurality of molds 1 having different patterns 4 onto the same substrate 2 in superposition. More specifically, the pattern surface 7 of each mold 1 can be made to have a target, shape (same shape), thus suppressing positional shifts between the patterns transferred onto the same substrate 2 in superposition.

Second Embodiment

Figure 5:
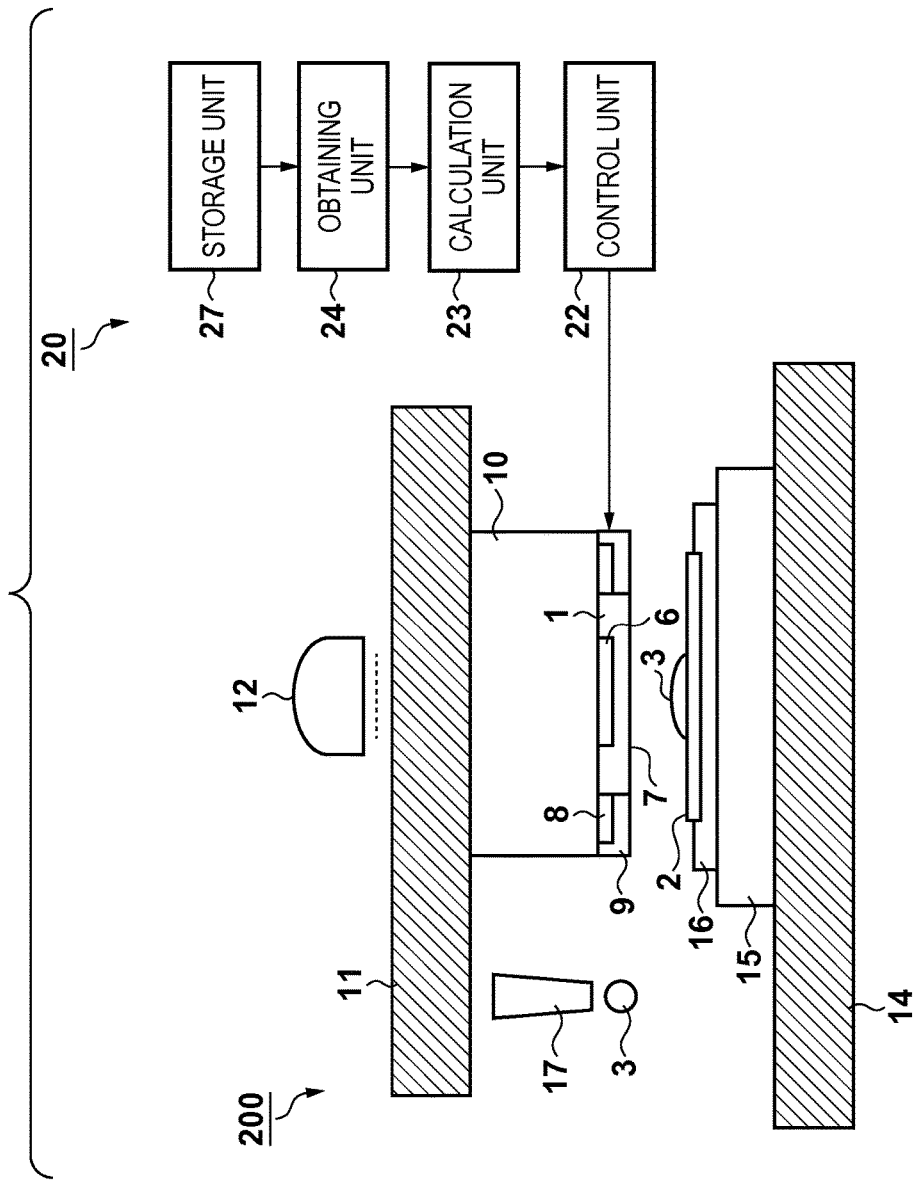
FIG. 5 is a view showing the configuration of an imprint apparatus according to the second embodiment of the present invention.

An imprint apparatus 200 according to the second embodiment of the present invention will be described with reference to FIG. 5. The imprint apparatus 200 according to the second embodiment is different from the imprint apparatus 100 according to the first embodiment in terms of a method of deforming a pattern surface 7 of a mold 1. The imprint apparatus 100 according to the first embodiment changes the pressure in the chamber 6 to deform the pattern surface 7. The imprint apparatus 200 according to the second embodiment includes an actuator 9 as the deforming unit 21 on the side surface of the mold 1, as shown in FIG. 5. The imprint apparatus 200 according to the second embodiment applies a force to the side surface of the mold 1 using the actuator 9 to deform the pattern surface 7. The actuator 9 includes, for example, a piezoelectric element, which is controlled in accordance with an electrical signal input from a control unit 22 to apply a bending or compression force to the mold 1.

A calculation unit 23 calculates the force to be applied to the mold 1 (the amount of actuation of the actuator 9) based on the thickness information of the mold 1 obtained by an obtaining unit 24, so that, the pattern surface 7 has a target shape. More specifically, the calculation unit 23 has an arithmetic expression according to which the amount of actuation of the actuator 9 is calculated in correspondence with the thickness information of the mold 1, or the correspondence between the thickness information of the mold 1 and the amount of actuation of the actuator 9. The calculation unit 23 calculates the amount of actuation of the actuator 9 using an arithmetic expression according to which the amount of actuation of the actuator 9 is calculated, or the correspondence between the thickness information of the mold 1 and the amount of actuation of the actuator 9. The control unit 22 controls the actuator 9 based on the amount of actuation of the actuator 9 calculated by the calculation unit 23.

In the second embodiment, as in the first embodiment, the pattern surface 7 can be made to have a target shape in an imprint process by controlling the amount of actuation of the actuator 9 in accordance with the thickness information of each mold 1. Although the pattern surface 7 of the mold 1 is deformed using only the amount of actuation of the actuator 9 in the second embodiment, it may be simultaneously deformed by the pressure in a chamber 6.

Third Embodiment

Figure 6:
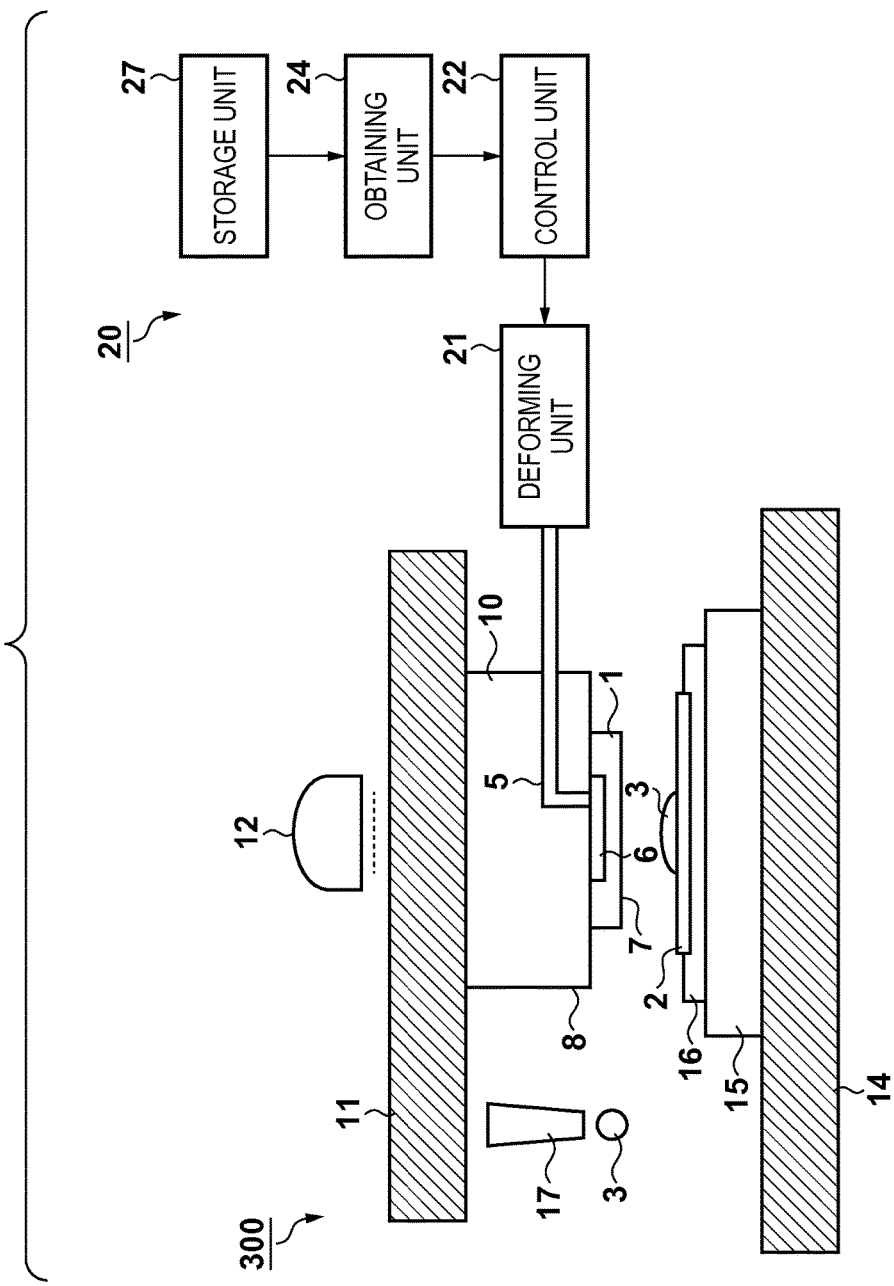
FIG. 6 is a view showing the configuration of an imprint apparatus according to the third embodiment of the present invention.

An imprint apparatus 300 according to the third embodiment of the present invention will be described with reference to FIG. 6. The imprint apparatus 300 according to the third embodiment is different, from the imprint apparatus 100 according to the first, embodiment in that in the former a control system 20 includes no calculation unit 23 but includes a storage unit 27. In the imprint apparatus 100 according to the first embodiment, the obtaining unit 24 obtains the thickness information of the mold 1, and the calculation, unit 23 calculates the pressure to be applied to the chamber 6 based on the thickness information of the mold 1, so that the pattern surface 7 has a target shape. In the imprint apparatus 300 according to the third embodiment, an obtaining unit 24 directly obtains the pressure which is to be applied to a chamber 6 and corresponds to each mold 1 from the storage unit 27, without calculating the pressure to be applied to the chamber 6.

The storage unit 27 stores pressure information indicating the correspondence between a plurality of molds 1 and the pressure to be applied to the chamber 6 so that a pattern surface 7 of each mold 1 has a target shape. The obtaining unit 24 specifies a mold 1 to be used in an imprint process, and obtains the pressure which is to be applied to the chamber 6 and corresponds to the specified mold 1, based on the pressure information stored in the storage unit 27. A control unit 22 controls a deforming unit 21 to apply the pressure obtained by the obtaining unit 24 to the chamber 6. With this operation, the deforming unit 21 pressurizes or depressurizes the chamber 6 so that, the pressure in the chamber 6 stays that, obtained by the obtaining unit 24. Although the imprint apparatus 300 according to the third embodiment deforms the pattern surface 7 using the pressure in the chamber 6, it may deform the pattern surface 7 using an actuator 9, as in the second embodiment. Alternatively, the imprint apparatus 300 may deform the pattern surface 7 of the mold 1 using both the amount of actuation of the actuator 9, and the pressure in the chamber 6.

In the third embodiment, the obtaining unit 24 directly obtains the pressure in the chamber 6 corresponding to each mold 1 from the storage unit 27. Hence, the imprint apparatus 300 can have a configuration simpler than that in either the first or second embodiment. In the third embodiment, as in the first embodiment, the pattern surface 7 can be made to have a target shape in an imprint process, as a matter of course.

<Embodiment of Method of Manufacturing Article>

A method of manufacturing an article according to an embodiment of the present invention is suitable for manufacturing various articles including a microdevice such as a semiconductor device and an element having a microstructure. This method includes a step of forming a pattern on a resin, dispensed on a substrate, using the above-mentioned imprint apparatus (a step of performing an imprint process on a substrate), and a step of developing the substrate having the pattern formed on it in the forming step. This method also includes subsequent known steps (for example, oxidation, film formation, vapor deposition, doping, planarization, etching, resist removal, dicing, bonding, and packaging). The method of manufacturing an article according to this embodiment is more advantageous in terms of at least one of the performance, quality, productivity, and manufacturing cost of an article than the conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-024522 filed on Feb. 7, 2012, which is hereby incorporated by reference herein in its entirety.

The invention claimed is:

1. An imprint apparatus which forms a pattern of an imprint material on a substrate using a mold having a pattern surface on which a pattern is formed, the apparatus comprising:
    an obtaining unit configured to specify the mold to be used to form the pattern of the imprint material on the substrate among a plurality of molds having the same pattern and to obtain thickness information of the specified mold;
    a calculation unit configured to calculate a force to be applied to a surface of the specified mold such that the pattern surface is deformed to a convex surface, based on the thickness information of the specified mold obtained by the obtaining unit; and
    a deforming unit configured to deform the pattern surface of the specified mold by applying the force calculated by the calculation unit from an outside of the specified mold to the surface such that the pattern surface forms the convex surface that bulges toward the substrate.

2. The apparatus according to claim 1, further comprising:
    a measuring unit configured to measure a thickness of the specified mold,
    wherein the obtaining unit obtains the thickness information from the thickness of the specified mold measured by the measuring unit.

3. The apparatus according to claim 1, further comprising:
    a storage unit configured to store a correspondence between the plurality of molds and the thickness information of each of the plurality of molds,
    wherein the obtaining unit specifies the mold to be used to form the pattern of the imprint material on the substrate among the plurality of molds, and obtains the thickness information of the specified mold based on the correspondence stored in the storage unit.

4. The apparatus according to claim 1, wherein the calculation unit calculates, without using an arithmetic expression, the force to be applied to the surface of the specified mold based on a correspondence between the thickness information of the specified mold and the force to be applied to the surface of the specified mold such that the pattern surface is deformed to the convex surface.

5. The apparatus according to claim 1,
    wherein the surface of the specified mold includes an opposite surface which is opposite to the pattern surface, and
    wherein the deforming unit deforms the pattern surface of the specified mold by applying the force calculated by the calculation unit to the opposite surface such that the pattern surface forms the convex surface that bulges toward the substrate.

6. The apparatus according to claim 1, wherein the surface of the specified mold includes a side surface of the specified mold, and wherein the deforming unit deforms the pattern surface of the specified mold by applying the force calculated by the calculation unit to the side surface of the specified mold such that the pattern surface forms the convex surface that bulges toward the substrate.

7. The apparatus according to claim 1, wherein the imprint material on the substrate is cured while the specified mold is brought in contact with the imprint material, and wherein the specified mold is separated from the cured imprint material on the substrate while the force calculated by the calculation unit is applied to the surface of the specified mold after curing the imprint material.

8. An imprint apparatus which forms a pattern of an imprint material on a substrate using a mold having a pattern surface on which a pattern is formed, the apparatus comprising:

a storage unit configured to store a correspondence between a plurality of molds having the same pattern and a force to be applied to a surface of each of the plurality of molds having the same pattern so that the pattern surface is deformed to a convex surface;

an obtaining unit configured to specify a mold to be used to form the pattern of the imprint material on the substrate among the plurality of molds having the same pattern, and obtain a force to be applied to the surface of the specified mold based on the correspondence stored in the storage unit; and a deforming unit configured to deform the pattern surface by applying the force obtained by the obtaining unit from outside of the specified mold to the surface such that the pattern surface forms the convex surface that bulges toward the substrate.

* * * * *